United States Patent
Yang

(10) Patent No.: US 9,490,215 B2
(45) Date of Patent: Nov. 8, 2016

(54) ORGANIC LIGHT-EMITTING DISPLAY DEVICE AND METHOD FOR MANUFACTURING ORGANIC LIGHT-EMITTING DISPLAY DEVICE

(71) Applicant: LG Display Co., Ltd., Seoul (KR)

(72) Inventor: HeeSeok Yang, Ansan-si (KR)

(73) Assignee: LG Display Co., Ltd., Seoul (KR)

( * ) Notice: Subject to any disclaimer, the term of this patent is extended or adjusted under 35 U.S.C. 154(b) by 106 days.

(21) Appl. No.: 14/547,488

(22) Filed: Nov. 19, 2014

(65) Prior Publication Data

US 2015/0137102 A1    May 21, 2015

(30) Foreign Application Priority Data

Nov. 21, 2013    (KR) ........................ 10-2013-0142545

(51) Int. Cl.
*H01L 23/544* (2006.01)
*H01L 51/00* (2006.01)
*H01L 51/56* (2006.01)
*B32B 37/14* (2006.01)
*B32B 38/00* (2006.01)
*B32B 38/18* (2006.01)

(52) U.S. Cl.
CPC ............. *H01L 23/544* (2013.01); *B32B 37/14* (2013.01); *B32B 37/144* (2013.01); *B32B 38/0012* (2013.01); *B32B 38/1833* (2013.01); *H01L 51/0097* (2013.01); *H01L 51/56* (2013.01); *B32B 2307/422* (2013.01); *B32B 2457/206* (2013.01); *H01L 2223/5442* (2013.01); *H01L 2223/54426* (2013.01); *H01L 2223/54486* (2013.01); *H01L 2924/0002* (2013.01); *Y02E 10/549* (2013.01); *Y02P 70/521* (2015.11); *Y10T 156/1051* (2015.01)

(58) Field of Classification Search
None
See application file for complete search history.

(56) References Cited

U.S. PATENT DOCUMENTS

| | | | | |
|---|---|---|---|---|
| 2010/0302478 A1* | 12/2010 | Nakagawa | ........... | G02B 6/0091 349/62 |
| 2013/0088671 A1* | 4/2013 | Drzaic | ................ | G02F 1/13452 349/106 |
| 2013/0148312 A1* | 6/2013 | Han | ......................... | H05K 7/00 361/736 |
| 2014/0152646 A1* | 6/2014 | Kang | ................... | G09G 3/2085 345/214 |
| 2014/0183473 A1* | 7/2014 | Lee | ..................... | H01L 51/0097 257/40 |

* cited by examiner

*Primary Examiner* — Ashok Patel
(74) *Attorney, Agent, or Firm* — Fenwick & West LLP

(57) ABSTRACT

Provided are an organic light-emitting display device and a method for manufacturing the same. A flexible substrate of the organic light-emitting display device is bent across a bend line and includes a first area, a first bending area adjacent to the first area, a second bending adjacent to the first bending area, and a second area adjacent to the second bending area. A wiring is formed over the first area, the first bending area, the second bending area, and the second area of the flexible substrate to electrically connect a display unit formed in the first area and a pad unit formed in the second area. A first alignment key is formed over the flexible substrate, and a second alignment is formed over the flexible substrate. The first alignment key is positioned to overlap the second alignment key with the flexible substrate bent across the bend line.

20 Claims, 12 Drawing Sheets

ORGANIC LIGHT-EMITTING DISPLAY DEVICE AND METHOD FOR MANUFACTURING ORGANIC LIGHT-EMITTING DISPLAY DEVICE

CROSS-REFERENCE TO RELATED APPLICATIONS

This application claims the priority of Korean Patent Application No. 10-2013-0142545 filed on Nov. 21, 2013 in the Korean Intellectual Property Office, the disclosure of which is incorporated herein by reference.

BACKGROUND OF THE DISCLOSURE

Field of the Disclosure

The present disclosure relates to an organic light-emitting display device and a method for manufacturing the same and more particularly, to an organic light-emitting display device with minimization of crack occurrences in a wiring in a flexible substrate via accurate bending of the flexible substrate, and a method for manufacturing the same.

Description of the Related Art

In recent years, a flexible display device has attracted of attention as a next generation display device. Such a flexible device may be capable of displaying an image in a case of a substrate bending like paper via formation of a display unit, a wiring and/or the like on a flexible substrate made of a flexible material such as plastic.

As the flexible display device has been increasingly applied to diverse fields such as a monitor of a computer, a television (TV), and a personal mobile device, a flexible display device having a large display area and a reduced volume and weight has been studied. Especially, an organic light-emitting display (OLED) device is a self-emission display device without a separate light source unlike a liquid crystal display (LCD) device. Accordingly, it has been attempted to manufacture a flexible display device with easy bending and can have a relatively thin thickness by using the flexible substrate in the organic light-emitting display device.

SUMMARY OF THE DISCLOSURE

When the flexible substrate of the organic light-emitting display device is bent, stress is exerted to a bending area of the flexible substrate. The flexible substrate may be not bent in an intended bending direction, that is, the bending direction thereof may be deviated. At this time, the stress exerted to the bending area is more increased, and, thus, cracks in a wiring in the bending area may easily occur. Accordingly, in order to minimize failures of the organic light-emitting display device due to the cracks in the wiring to improve reliability of the organic light-emitting display device, the present disclosure describes an organic light-emitting display device enabling accurate bending of the flexible substrate in the intended bending direction, and a method for manufacturing the same.

An object of the present disclosure is to provide an organic light-emitting display device with minimization of cracks occurrences in a wiring in a bending area for a flexible substrate bending, and a method for manufacturing the same.

The objects of the present disclosure are not limited to the aforementioned objects, and, rather, other objects not mentioned above will be apparent to those skilled in the art from the following descriptions.

According to an aspect of the present disclosure, there is provided an organic light-emitting display device with a flexible substrate bent across a bend line. The flexible substrate of the organic light-emitting display device includes a first area, a first bending area adjacent to the first area, a second bending area adjacent to the first bending area, and a second area adjacent to the second bending area. The flexible substrate is bent such that the first area is positioned to at least partially overlap the second area and the first bending area is positioned to at least partially overlap the second bending area. A wiring unit is formed across the first area, the first bending area, the second bending area, and the second area of the flexible substrate. The wiring unit is configured to electrically connect together a display unit formed in the first area of the flexible substrate and a pad unit formed in the second area of the flexible substrate. A first alignment key is formed over the flexible substrate and a second alignment key is formed over the flexible substrate. The first alignment key is positioned to overlap the second alignment key with the flexible substrate bent across the bend line. The wiring formed at the flexible substrate is also bent along with the bending of the flexible substrate. Cracks may occur in the bent wiring, and in order to minimize the crack occurrence, a shape of the wiring is designed in consideration of a bending direction of the flexible substrate. However, even though the shape of the wiring is designed in consideration of a bending direction of the flexible substrate, when the flexible substrate is not accurately bent in an intended bending direction, it is difficult to minimize the crack occurrence in the wiring. Accordingly, by bending the flexible substrate to allow the first alignment key and the second alignment key to face each other, it is possible to accurately bend the flexible substrate in the intended bending direction and to minimize the cracks occurring in the wiring.

According to another aspect of the present disclosure, there is provided a method for manufacturing an organic light-emitting display device which can bend a flexible substrate of the organic light-emitting display device in an intended bending direction. The method for manufacturing an organic light-emitting display device includes securing the flexible substrate to a stage, bending the flexible substrate in the first bending area and the second bending area, clamping the second area of the bent flexible substrate using a clamp, aligning the first alignment key to overlap with the second alignment key by moving the stage or clamp until the first alignment key overlaps the second alignment key, and pressing the flexible substrate until the first area of the flexible substrate is in contact with the second area of the flexible substrate. By matching the first alignment key to the second alignment key, the flexible substrate can be accurately bent in the intended bending direction.

Details of other exemplary embodiments are included in the detailed description and drawings.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
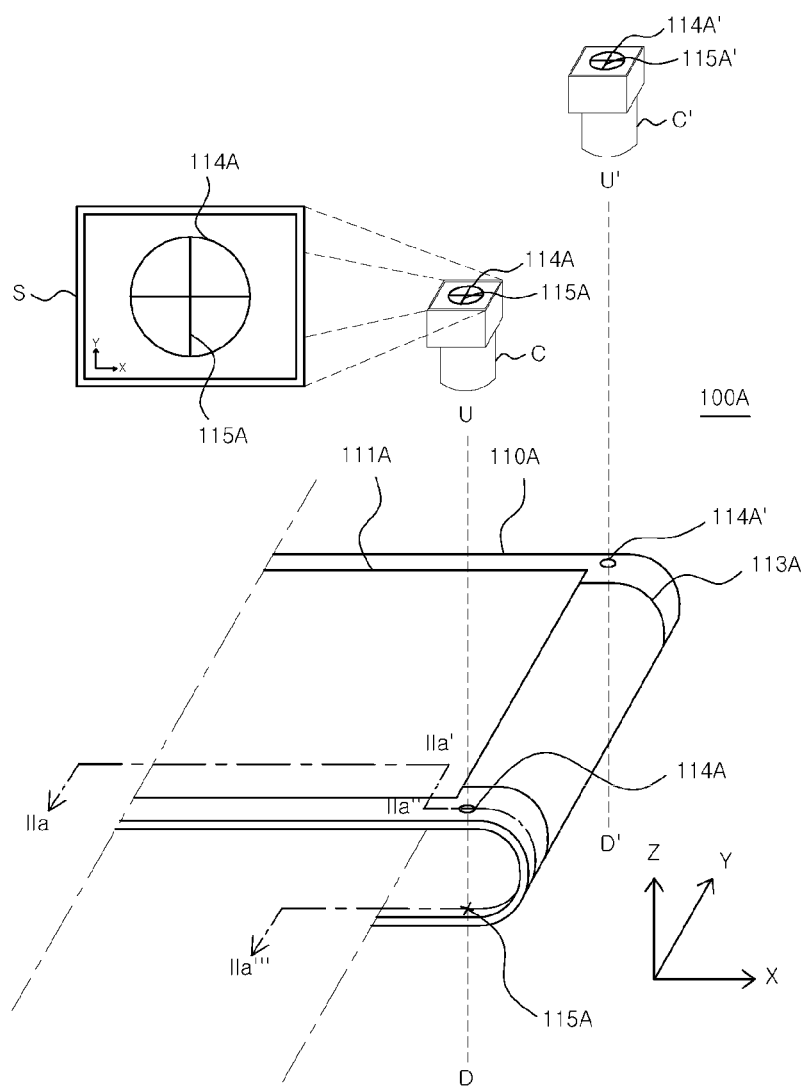
FIG. 1A is a perspective view of an organic light-emitting display device according to an exemplary embodiment of the present disclosure when a flexible substrate thereof is bent.

Various advantages and features of the present disclosure and methods accomplishing thereof will become apparent from the following description of embodiments with reference to the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used for illustrating various components, the components are not limited by the terms. The above terms are used only to discriminate one component from the other component. Therefore, a first component mentioned below may be a second component within the technical spirit of the present disclosure.

The same reference numerals indicate the same elements throughout the specification.

In the drawings, size and thickness of each element are arbitrarily illustrated for convenience of description, and the present disclosure is not necessarily limited to those illustrated in the drawings.

Respective features of various exemplary embodiments of the present disclosure can be partially or totally joined or combined with each other and as sufficiently appreciated by those skilled in the art, various interworking or driving can be technologically achieved and the respective exemplary embodiments may be executed independently from each other or together executed through an association relationship.

Hereinafter, the present disclosure will be described in detail with reference to the attached drawings.

Figure 1B:
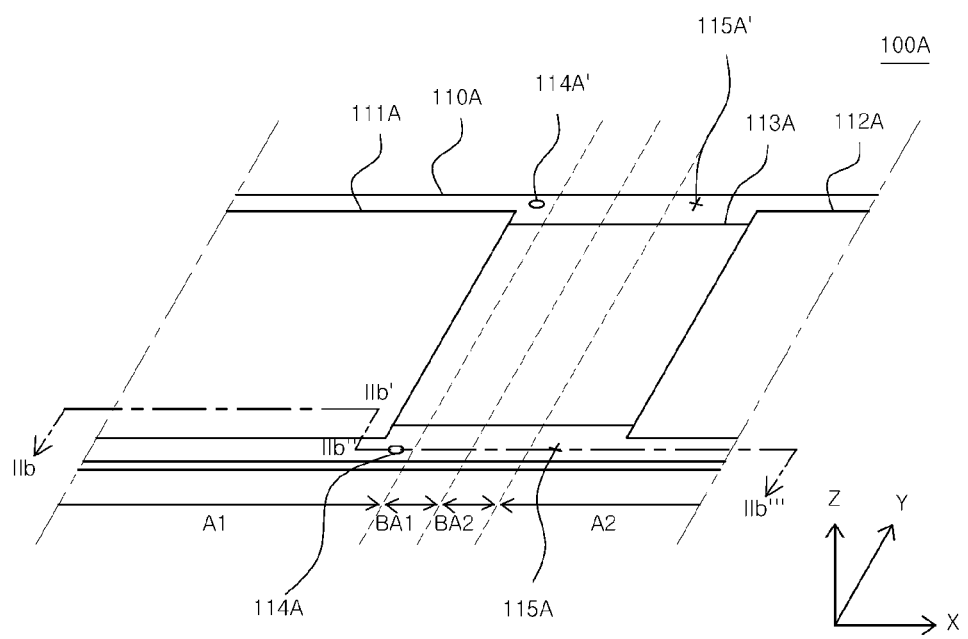
FIG. 1B is a perspective view of the organic light-emitting display device according to the exemplary embodiment of the present disclosure before a flexible substrate is bent.

FIG. 1A is a perspective view of an organic light-emitting display device according to an exemplary embodiment of the present disclosure in a bent state of a flexible substrate. FIG. 1B is a perspective view of the organic light-emitting display device according to an exemplary embodiment of the present disclosure before the flexible substrate is bent. Referring to FIGS. 1A and 1B, an organic light-emitting display device 100A includes a flexible substrate 110A, a display unit 111A, a pad unit 112A, a wiring unit 113A, first alignment keys 114A and 114', and second alignment keys 115A and 115A'. Bending of the flexible substrate 100A shown in FIG. 1B may generate the organic light-emitting display device 100A accurately bent in an intended bending direction.

Referring to FIGS. 1A and 1B, the term "bending" and derivations thereof as used herein means that, for the flexible substrate 110A having a first area A1, a first bending area BA1, a second bending area BA2, and a second area A2 and positioned on an XY plane, one end in a positive position of an X axis moves gradually toward a negative position of the X axis via a negative position of a Z axis. When the flexible substrate 100A is bent across a bend line, the first bending area BA1 and the second bending area BA2 are symmetric with respect to a boundary therebetween. Although not shown in FIGS. 1A and 1B, the bend line may be located in the first bending area BA1, the second bending area BA2, or at the boundary between the first bending area BA1 and the second bending area BA2. Further, when the flexible substrate 100A is bent in a predetermined direction, the predetermined direction is referred to as a bending direction as used herein.

The flexible substrate 110A is a substrate for supporting various elements of the organic light-emitting display device 100A, and is made of a flexible material.

Referring to FIG. 1B, the flexible substrate 110A includes the first area A1, the first bending area BA1 extending from one end side of the first area A1, the second bending area BA2 extending from the first bending area BA1, and the second area A2 extending from one end side of the second bending area BA2. One side of the first area A1, one end side of the first bending area BA1, and one end side of the second bending area BA2 are parallel to each other.

The display unit 111A is formed in the first area A1 of the flexible substrate 110A on a face thereof, and the pad unit 112A is formed in the second area A2. The wiring unit 113A electrically connecting the display unit 111A and the pad unit 112A is formed over the first area A1, the first bending area BA1, the second bending area BA2, and the second area A2. The wiring unit 113A may include a plurality of wirings. The wiring unit 113A over the first bending area BA1 and the second bending area BA2 may include a wiring extending in a direction oblique the bending direction perpendicular to one end side of the first area A1.

The flexible substrate 110A may be bent as shown in FIG. 1B so that the first bending area BA1 and the second bending area BA2 are bent, and the second area A2 faces away from at least a portion of the first area A1. As the flexible substrate 110A is bent, the pad unit 112A along the same plane as the display unit 111A in FIG. 1B is arranged along a different from but parallel plane from the previous plane.

As the first bending area BA1 and the second bending area BA2 are narrow, that is, as lengths of the first bending area BA1 and the second bending area BA2 shown in FIG. 1B in the X axis direction are small, a radius of curvature bent at the first bending area BA1 and the second bending area BA2 is small. For example, when the widths of the first bending area BA1 and the second bending area BA2 of the flexible substrate 110A are several millimeters or less, the flexible substrate 110A may be seen as both folded portions thereof are in a contact with each other.

The first alignment keys 114A and 114A' are alignment keys formed in at least one area of the first area A1 and the first bending area BA1. The second alignment keys 115A and 115A' are alignment keys formed in at least one area of the second area A2 and the second bending area BS2 so as to correspond to the first alignment keys 114A and 114A' respectively. Although, referring to FIG. 1B, the first alignment keys 114A and 114A' and the second alignment keys 115A and 115A' are formed in the first and second areas A1 and A2 respectively, the first alignment keys 114A and 114A' and the second alignment keys 115A and 115A' may be formed in the first and second bending areas BA1 and BA2 respectively.

The correspondence between the first alignment keys 114A and 114A' and the second alignment keys 115A and 115A' prior to the bending of the flexible substrate 110A may mean that, as shown in FIG. 1B, positions of the first alignment keys 114A and 114A' and the second alignment keys 115A and 115A' are symmetric with respect to the boundary between the first bending area BA1 and the second bending area BA2. Further, the first alignment keys and the second alignment keys being symmetric with respect to the boundary may mean that the position of the centers of the first alignment keys 114A and 114A' and the second alignment keys 115A and 115A' are spaced apart from the boundary at the same distance.

The correspondence between the first alignment keys 114A and 114A' and the second alignment keys 115A and 115A' in the accurate bending state of flexible substrate 110A in the intended bending direction may mean that, as shown in FIG. 1A, the first alignment keys 114A and 114A' and the second alignment keys 115A and 115A' face away each other in the bending state. Further, the facing-away between the first alignment keys 114A and 114A' and the second alignment keys 115A and 115A' means that, as shown in FIG. 1A, the second alignment keys 115A and 115A' overlaps the first alignment keys 114A and 114A' for imaging the first alignment keys 114A and 114A' respectively using imaging devices C and C' such as cameras from positions U and U' above the first alignment keys 114A and 114A'. In addition and/or in an alternative, facing-away means that the first alignment keys 114A and 114A' overlaps with the second alignment keys 115A and 115A' respectively for imaging the second alignment keys 115A and 115A from positions D and D' below the second alignment keys 115A and 115A'. In this case, imaginary straight lines UD and U'D' respectively extending between and beyond centers of the first alignment keys 114A and 114A' and centers of the second alignment keys 115A and 115A' are normal to the first area A1 and/or the second area A2. That is, centers of the first alignment keys 114A and 114A' are respectively in line with centers of the second alignment keys 115A and 115A' when viewed from a direction normal to the first area A1 and the second area A2.

The overlap between the first alignment keys 114A and 114A' and the second alignment keys 115A and 115A' may be displayed on a screen S of the camera C as shown in FIG. 1A. As shown in FIG. 1A, when the first alignment keys 114A and 114A' of circular shapes ("O" shapes) and the second alignment keys 115A and 115A' of cross shapes ("+" shape) face away each other, the circular shapes ("O" shapes) shapes and cross shapes ("+" shape) overlaps each other for imaging the first alignment keys 114A and 114A' or the second alignment keys 115A and 115A' from the positions U and U' or D and D' respectively using the imaging devices C and C'. In this way, it is imaged as the "+" shapes are respectively enclosed by the "O" shapes. That is, centers of the cross shapes of the second alignment keys 115A and 115A' are respectively in line with centers of the circular shapes of the first alignment keys 114A and 114A'.

The imaging of first alignment keys 114A and 114A' or the second alignment keys 115A and 115A' involves using not only a visible light wavelength but also different wavelengths. Accordingly, even though a non-transparent member is positioned between or below or above the first alignment keys 114A and 114A' and the second alignment keys 115A and 115A, all of the first alignment keys 114A and 114A' and the second alignment keys 115A and 115a' may be imaged.

Referring to FIGS. 1A and 1B, when the first bending area BA1 and the second bending area BA2 of the flexible substrate 110A are bent in the positive direction of the X axis, the highest stress is exerted in the positive direction of the X axis in the first bending area BA1 and the second bending area BA2. That is, the highest stress is exerted in the bending direction of the flexible substrate 110A. Accordingly, if wirings of the wiring unit 113A formed over the first bending area BA1 and the second bending area BA2 extend straightly in the positive direction of the X axis, the stress exerted in the positive direction of the X axis of the flexible substrate 110A is exerted to the wirings, and, thus, cracks may occur in the wiring unit 113A.

In order to minimize the occurrence of the cracks in the wiring unit 113A, a shape of the wiring may be designed in consideration of the bending direction of the flexible substrate 110A. For example, when the wiring extends obliquely in the bending direction of the flexible substrate 110A, only some of the stress exerted in the bending direction of the flexible substrate 110A is transferred to the wiring, so that the occurrence of the crack can be minimized in the wiring unit 113A.

Accordingly, the wiring may be formed so as to include a part extending in an oblique direction to the bending direction of the flexible substrate 110A. For example, the wiring unit 113A formed over the first bending area BA1 and the second bending area BA2 of the flexible substrate 110A may include a zigzag-shaped wiring or a diamond-shaped wiring.

Even though the shape of the wiring of the wiring unit 113A is designed in consideration of the bending direction of the flexible substrate 110A, when the flexible substrate 110A is bent in a direction different from the intended bending direction, the stress exerted to the wiring is not minimized. Accordingly, in order to minimize the occurrence of the crack in the wiring unit 113A, the flexible substrate 110A needs to be accurately bent in the intended bending direction.

In the organic light-emitting display device 100A according to the exemplary embodiment of the present disclosure, the flexible substrate 110A can be accurately bent in the intended bending direction through the first alignment keys 114A and 114A' and the second alignment keys 115A and 115A' that are formed to correspond to each other. By accurately bending the flexible substrate 110A in the intended bending direction, the crack occurrence can be minimized in the wirings formed in the first bending area BA1 and the second bending area BA2. Further, as the crack occurrence is minimized, an error rate of the organic light-emitting display device 100A caused by the crack can be minimized.

The first alignment keys 114A and 114A' and the second alignment keys 115A and 115A' may be formed in various shapes as well as the 'O' and '+' shapes shown in FIGS. 1A and 1B so as to allow the flexible substrate 110A to be accurately bent in the intended bending direction.

Figure 1C:
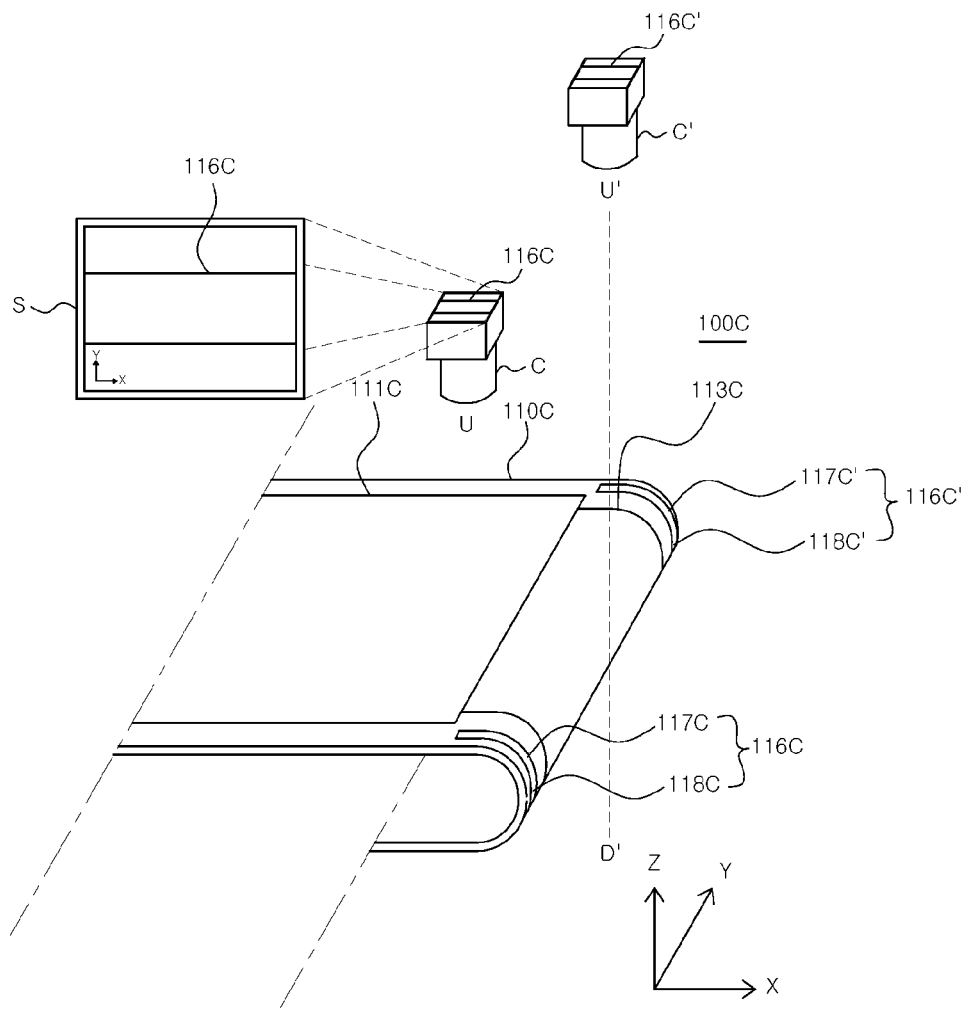
FIG. 1C is a perspective view of an organic light-emitting display device according to an exemplary embodiment of the present disclosure in a bent state of a flexible substrate, for illustrating elongated alignment keys.
Figure 1D:
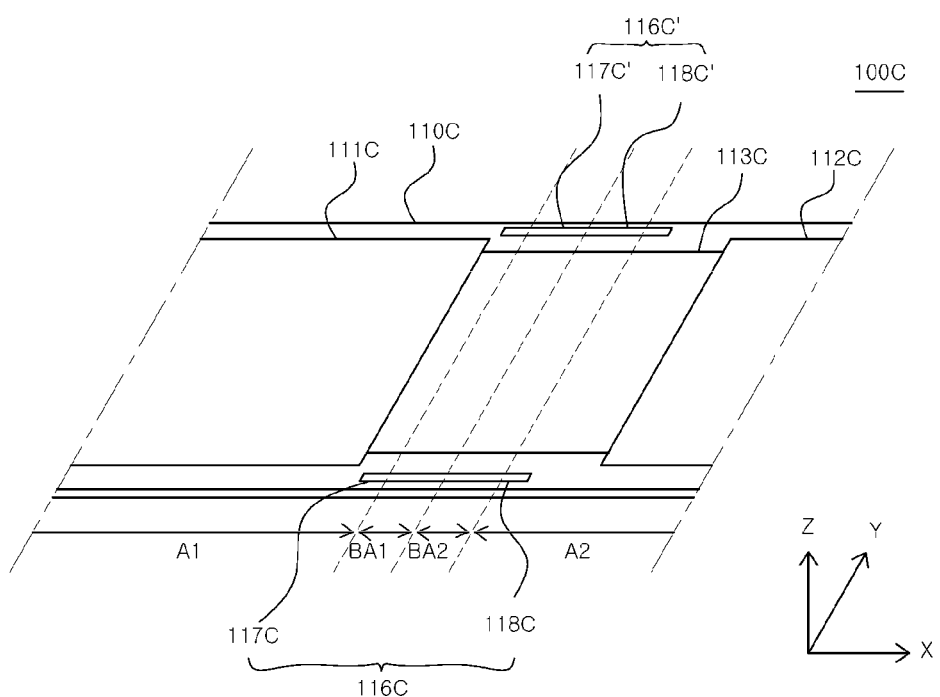
FIG. 1D is a perspective view of the organic light-emitting display device according to the exemplary embodiment of the present disclosure prior to bending of the flexible substrate, for illustrating the elongated alignment keys.

FIG. 1C is a perspective view of an organic light-emitting display device according to an exemplary embodiment of the present disclosure in a bent state of a flexible substrate for illustrating elongated alignment keys. FIG. 1D is a perspective view of the organic light-emitting display device according to the exemplary embodiment of the present disclosure before the flexible substrate is bent for illustrating the elongated alignment keys. Referring to FIGS. 1C and 1D, an organic light-emitting display device 100C includes a flexible substrate 110C, a display unit 111C, a pad unit 112C, a wiring unit 113C, and elongated alignment keys 116C and 116C'. By bending the flexible substrate 110C shown in FIG. 1C, the organic light emitting display device 100C that is accurately bent in the intended bending direction is formed.

The organic light-emitting display device 100C shown in FIGS. 1C and 1D has the substantially same configuration as that of the organic light-emitting display device 100A described in FIGS. 1A and 1B except that the shapes of the first alignment keys and the second alignment keys are different.

Referring to FIG. 1D, the elongated alignment keys 116C and 116C' are formed by connecting first alignment keys 117C and 117C' to second alignment keys 118C and 118C'. In one embodiment, the elongated alignment keys 116C and 116C' form a rectangle. In the elongated alignment keys, the elongated alignment keys formed over the first area A1 and the first bending area BA1 mean the first alignment keys 117C and 117C', and the alignment keys formed over the second area A2 and the second bending area BA2 mean the second alignment keys 118C and 118C'.

When the flexible substrate 110C is bent, the elongated alignment keys 116C and 116C' are also bent along with the bending of the flexible substrate 110C. As shown in FIG. 1C, if the flexible substrate 110C is accurately bent in the intended bending direction, when the bent elongated alignment keys 116C and 116C' are imaged by the imaging device C and C' such a cameras from the positions U and U' above the elongated alignment keys 116C and 116C', the bent elongated alignment keys 116C and 116C' are completely overlapped without being deviated, so that the alignment keys are seen as one bar. That is, first portions of the rectangles corresponding to the first alignment keys 117C and 117C' are respectively in line with second portions of the rectangles corresponding to the second alignment keys 118C and 118C' when viewed from a direction normal to the first area A1 and the second area A2.

Meanwhile, it has been illustrated in FIG. 1D that the elongated alignment keys 116C and 116C' are formed over the first area A1, the first bending area BA1, the second bending area BA2, and the second area A2, but may be formed over only the first bending area BA1 and the second bending area BA2.

Figure 1E:
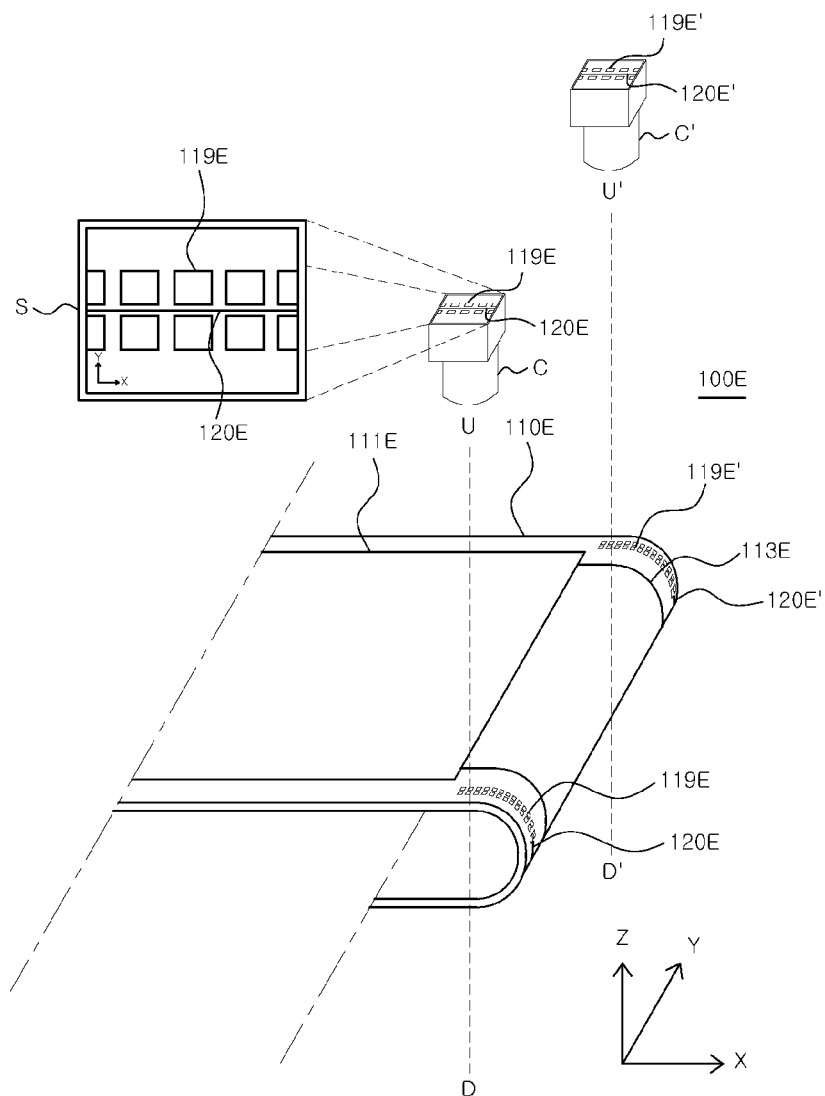
FIG. 1E is a perspective view of an organic light-emitting display device according to an exemplary embodiment of the present disclosure in a bent state of a flexible substrate, for illustrating an alignment key including a plurality of patterns.
Figure 1F:
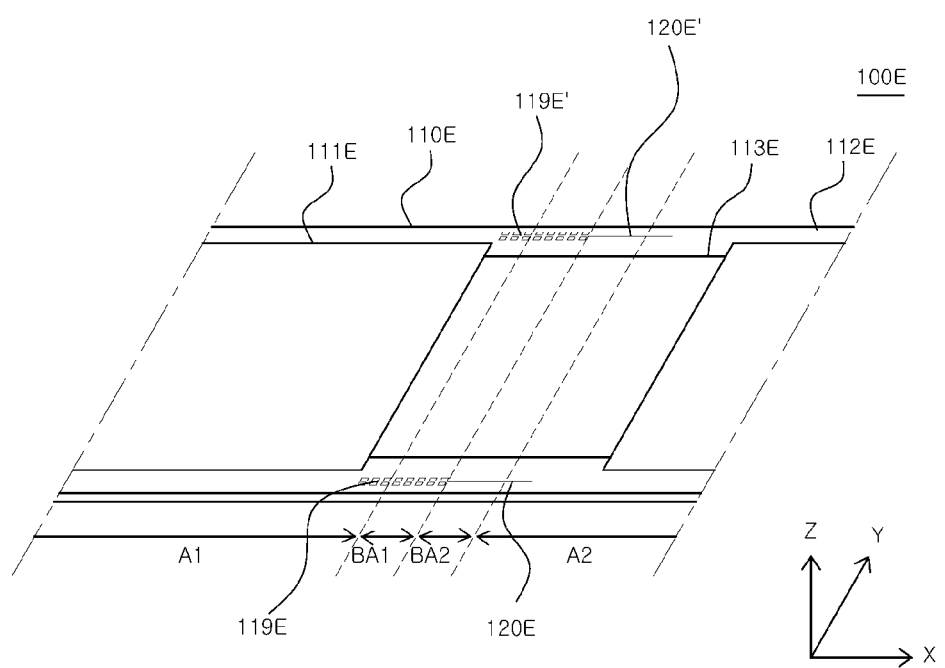
FIG. 1F is a perspective view of the organic light-emitting display device according to the exemplary embodiment of the present disclosure prior to bending of the flexible substrate, for illustrating the alignment key including the plurality of patterns.

FIG. 1E is a perspective view of an organic light-emitting display device according to an exemplary embodiment of the present disclosure in a bent state of a flexible substrate for illustrating an alignment key including a plurality of patterns. FIG. 1F is a perspective view of the organic light-emitting display device according to the exemplary embodiment of the present disclosure before the flexible substrate is bent for illustrating the alignment key including the plurality of patterns. Referring to FIGS. 1E and 1F, an organic light-emitting display device 100E includes a flexible substrate 110E, a display unit 111E, a pad unit 112E, a wiring unit 113E, first alignment keys 119E and 119E', and second alignment keys 120E and 120E'. By bending the flexible substrate 110E shown in FIG. 1E, the organic light-emitting display device 100E that is accurately bent in the intended bending direction is formed.

The organic light-emitting display device 100E shown in FIGS. 1E and 1F has the substantially same configuration as that of the organic light-emitting display device 100C described in FIGS. 1C and 1D except that the shapes of the first alignment keys and the second alignment keys are different.

Referring to FIG. 1F, the first alignment keys 119E and 119E' include a plurality of patterns, and the second alignment keys 120E and 120E' are formed to correspond to the plurality of patterns of the first alignment keys 119E and 119E'. Here, the second alignment keys 120E and 120E' being formed to correspond to the plurality of patterns of the first alignment keys 119E and 119E' means that if the first alignment keys 119E and 119E' are imaged by the imaging devices C and C' such as cameras from the positions U and U' above the first alignment keys 119E and 119E' when the flexible substrate 110E is accurately bent in the intended bending direction, the second alignment keys 120E and 120E' are imaged as being overlapped with the first alignment keys 119E and 119E'.

As shown in FIGS. 1E and 1F, if the first alignment keys 119E and 119E' include a plurality of squares comprising a first row of squares and a second row of squares, and the second alignment keys 120E and 120E' include lines corresponding to the plurality of squares of the first alignment keys 119E and 119E', when the flexible substrate 110E is accurately bent in the intended bending direction, the first alignment keys 119E and 119E' and the second alignment keys 120E and 120E' are overlapped with each other, so that these alignment keys are seen as if the lines of the second alignment keys 120E and 120E' are positioned between the plurality of squares of the first alignment keys 119E and 119E' as shown in FIG. 1E (e.g., between the first row of squares and the second row of squares).

In FIGS. 1E and 1F, although it has been illustrated that the second alignment keys 120E and 120E' are the lines corresponding to the plurality of squares of the first alignment keys 119E and 119E', the second alignment keys 120E and 120E' may be formed in various shapes corresponding to the plurality of squares of the first alignment keys 119E and 119E'. For example, if the second alignment keys 120E and 120E' have shapes in which '+' shapes are arranged in a line, these alignment keys may be seen as if the '+' shapes are positioned between the plurality of squares of the first alignment keys 119E and 119E'.

Figure 2A:
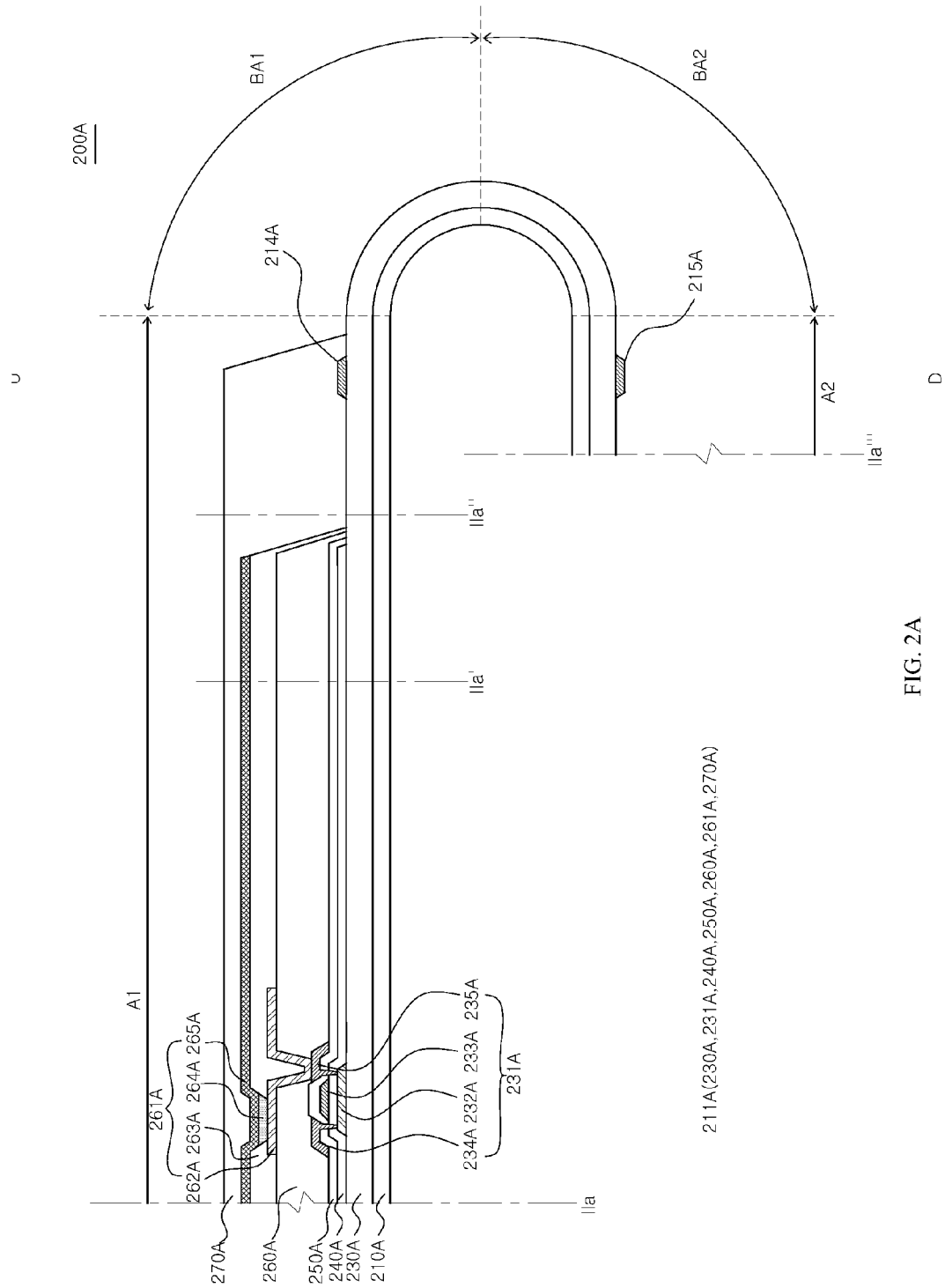
FIG. 2A is a cross-sectional view taken along line IIa-IIa''-IIa'-IIa''' of FIG. 1A for illustrating arrangement of first and second alignment keys and a display unit of the organic light-emitting display device shown in FIG. 1A.
Figure 2B:
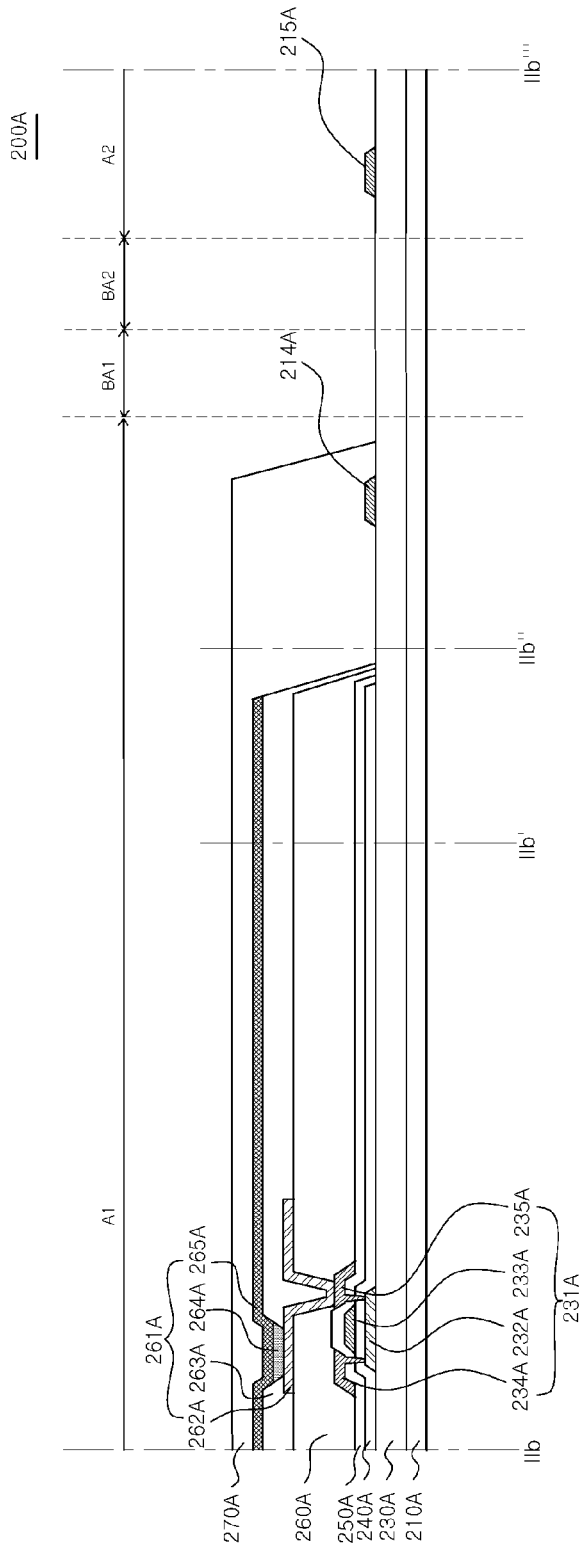
FIG. 2B is a cross-sectional view taken along line IIb-IIb'-IIb''-IIb''' of FIG. 1B for illustrating the arrangement of the first and second alignment keys and the display unit of the organic light-emitting display device shown in FIG. 1B.

FIG. 2A is a cross-sectional view taken along line IIa-IIa'-IIa"-IIa''' of FIG. 1A for illustrating arrangement of the first and second alignment keys and the display unit of the organic light-emitting display device shown in FIG. 1A. FIG. 2B is a cross-sectional view taken along line IIb-IIb'-IIb"-IIb''' of FIG. 1B for illustrating the arrangement of the first and second alignment keys and the display unit of the organic light-emitting display device shown in FIG. 1B.

Referring to FIGS. 2A and 2B, an organic light-emitting display device 200A includes a flexible substrate 210A, a display unit 211A, a first alignment key 214A, and a second alignment key 215A. The display unit 211A of the organic light-emitting display device 200A includes a buffer layer 230A, a thin-film transistor 231A, a gate insulating layer 240A, an interlayer insulating layer 250A, an overcoat layer 260A, an organic light-emitting element 261A, and a sealing layer 270A. By bending the flexible substrate 210A shown in FIG. 2A, the organic light-emitting display device 200A that is accurately bent in the intended direction is formed.

The buffer layer 230A is formed on the flexible substrate 210A. The buffer layer 230A prevents infiltration of moisture or impurities through the flexible substrate 210A. However, the buffer layer 230A need not necessarily be formed. The buffer layer 230A may be formed depending on a kind of the flexible substrate 210A or a kind of the thin-film transistor 231A used in the organic light-emitting display device 200A. As shown in FIGS. 2A and 2B, the buffer layer 230A extends from the display unit 211A to the first area A1, the first bending area BA1 and the second bending area BA2 over which the first alignment key 214A is formed, and the second area A2 over which the second alignment key 215A is formed.

Although it has been illustrated in FIGS. 2A and 2B that the buffer layer 230A is formed over the first bending area BA1 and the second bending area BA2, the buffer layer 230A may not be formed over the first bending area BA1 and the second bending area BA2 so as to allow the flexible substrate 210A to be easily bent.

The thin-film transistor 231A is defined as including an active layer 232A, a gate electrode 233A, a source electrode 234A, and a drain electrode 235A. In the present disclosure, for the convenience in description, only the driving thin-film transistor 231A among various thin-film transistors that can be included in the organic light-emitting display device 200A has been illustrated. Further, although it has been described in the present disclosure that the thin-film transistor 231A has a coplanar structure, the thin-film transistor may have an inverted staggered structure.

The active layer 232A is formed on the buffer layer 230A. When the buffer layer 230A is not formed, the active layer 232A may be formed on the flexible substrate. The active layer 232A may have a channel area in which a channel of the thin-film transistor 231A is formed.

The gate insulating layer 240A is formed on the active layer 232A. The gate insulating layer 240A insulates the active layer 232A from the gate electrode 233A. Although it has been illustrated in FIGS. 2A and 2B that the gate insulating layer 240A is formed on the active layer 232A and the buffer layer 230A, since the gate insulating layer 240A has only to insulate the active layer 232A from the gate electrode 233A, the gate insulating layer may be formed on only the active layer 232A. The gate insulating layer 240A is formed to have a contact hole that opens a partial area of the active layer 232A.

The gate electrode 233A is formed on the gate insulating layer 240A. The gate electrode 233A is overlapped with at least a part of the active layer 232A, particularly, the channel area of the active layer 232A.

The interlayer insulating layer 250A is formed on the gate electrode 233A. The interlayer insulating layer 250A is formed on the entire surface of the flexible substrate 210A, and has a contact hole that opens a partial area of the active layer 232A. The source electrode 234A and the drain electrode 235A are formed on the gate insulating layer 240A, and the source electrode 234A and the drain electrode 235A are electrically connected to the active layer 232A through the contact holes of the gate insulating layer 240A and the interlayer insulating layer 250A.

The overcoat layer 260A is formed on the thin-film transistor 231A. The overcoat layer 260A is a layer for planarizing a top of the flexible substrate 210A and serves as a planarization layer. The overcoat layer 260A has a contact hole through which the source electrode 234A or the drain electrode 235A are exposed. In FIGS. 2A and 2B, since the thin-film transistor 231A is of P-type, the overcoat layer 260A has a contact hole through which the drain electrode 235A is exposed.

The first alignment key 241A and the second alignment key 215A are formed to correspond to each other. It has been illustrated in FIGS. 2A and 2B that the first alignment key 214A and the second alignment key 215A are respectively formed in the first area A1 and the second area A2, but may be formed in the first bending area BA1 and the second bending area BA2.

The first alignment key 214A and the second alignment key 215A are formed on the same plane. As shown in FIG. 2B, the first alignment key 214A and the second alignment key 215A are formed on the gate insulating layer. The first alignment key 214A and the second alignment key 215A are made of the same material as that of the gate electrode 233A, or the source and drain electrodes 234A and 235A. It has been illustrated in FIGS. 2A and 2B that the first alignment key 214A and the second alignment key 215A are made of the same material as that of the gate electrode 233A. The first alignment key 214A and the second alignment key 215A may be formed in the same process, and may be simultaneously formed in the process of forming the gate electrode 233A. As described above, the first alignment key 214A and the second alignment key 215A may be formed without an additional process or additional equipment.

Although it has been illustrated in FIGS. 2A and 2B that the first alignment key 214A and the second alignment key 215A are made of the same material as that of the gate electrode 233A, the first alignment key 214A and the second alignment key 215A may be made of the same material as that of the source and drain electrodes 234A and 235A. However, the present disclosure is not limited to the above-stated example and the first alignment key 214A and the second alignment key 215A may be made of different materials.

The first alignment key 214A or the second alignment key 215A may be a hole penetrating through at least one of the flexible substrate 210A, the buffer layer 230A and the sealing layer 270A.

The organic light-emitting element 261A that includes an anode 262A, a bank layer 263A, an organic emissive layer 264A, and a cathode 265A is formed on the overcoat layer 260A.

The anode 262A is formed on the overcoat layer 260A. Since the anode 262A needs to supply holes, the anode includes a conductive material having a high work function.

The anode 262A includes a transparent conductive layer having a high work function, and the transparent conductive layer may be made of a transparent conductive oxide (TCO).

When the organic light-emitting display device 200A is a top emission type organic light-emitting display device, the anode 262A includes a reflection layer formed below the transparent conductive layer. The reflection layer reflects light emitted to below the organic emissive layer 264A among light emitted from the organic emissive layer 264A to guide the light toward above the organic emissive layer 264A. The reflection layer is a conductive layer having excellent reflectivity.

The top emission type organic light-emitting display device in the present disclosure means an organic light-emitting display device in which light emitted from the organic light-emitting element is released toward above the organic light-emitting display device. The light emitted from the organic light-emitting element of the top emission type organic light-emitting display device is released toward a top surface of the substrate on which the thin-film transistor for driving the organic light-emitting display device is formed.

In the present disclosure, the anode 262A has been defined as including the transparent conductive layer and the reflection layer, and in FIGS. 2A and 2B, the anode 262A has been illustrated as one layer including the transparent conductive layer and the reflection layer.

The anode 262A is electrically connected to the drain electrode 235A of the thin-film transistor 231A through the contact hole of the overcoat layer 260A.

The bank layer 263A is formed on the anode 262A and the overcoat layer 260A. The bank layer 263A opens a part of the anode 262A.

The organic emissive layer 264A is formed on the anode 262A. The organic emissive layer 264A may be an organic emissive layer that emits light of any one color of red, green and blue, or may be a white organic emissive layer that emits white light.

The cathode 265A is formed on the organic emissive layer 264A. Since the cathode 265A needs to supply electrons, the cathode is made of a conductive material having a low work function. The cathode 265A is not patterned, and is formed as one layer on the organic emissive layer 264A. As shown in FIGS. 2A and 2B, when the organic light-emitting display device 200A is the top emission type organic light-emitting display device, since the cathode 265A is formed at a very thin thickness, the organic light-emitting display device may be substantially transparent.

The sealing layer 270A is formed on the cathode 265A, as a sealing member for covering the organic light-emitting element 261A. The sealing layer 270A protects internal elements of the organic light-emitting display device 200A, such as the thin-film transistor 231A and the organic light-emitting element 261A, from the infiltration of external moisture. As shown in FIGS. 2A and 2B, the sealing layer 270A extends up to a position at which the first alignment key 214A can be covered. By extending the sealing layer 270A up to the position at which the first alignment key 214A can be covered, the sealing layer 270A covers an outer edge of the flexible substrate 210A to further protect the internal elements from the infiltration of external moisture.

Meanwhile, although it has been illustrated in FIGS. 2A and 2B that the sealing layer 270A covers the first alignment key 214A, the sealing layer 270A is formed to cover only the thin-film transistor 231A and the organic light-emitting element 261A, so that it is possible to protect the internal elements of the organic light-emitting display device 200A from the infiltration of external moisture.

Although it has been illustrated in FIGS. 2A and 2B that the buffer 230A extends up to areas where the first alignment key 214A and the second alignment key 215A are formed, the buffer layer 230A may be formed so as not to extend up to the areas where the first alignment key 214A and the second alignment key 215A are formed. In such a case, the first alignment key 214A and the second alignment key 215A may be directly formed on the flexible substrate 210A.

In FIGS. 2A and 2B, it has been illustrated that the gate insulating layer 240A, the interlayer insulating layer 250A, the overcoat layer 260A and the bank layer 263A are not formed up to the area where the first alignment key 214A is formed, at least one of the gate insulating layer 240A, the interlayer insulating layer 250A, the overcoat layer 260A and the bank layer 263A may be formed to extend up to the area where the first alignment key 214A is formed. In such a case, the first alignment key 214A may be formed on the gate insulating layer 240A, or may be formed on the interlayer insulating layer 250A.

Although not shown in FIGS. 2A and 2B, the organic light-emitting display device 200A according to the exemplary embodiment of the present disclosure may further include supplement members. The supplement members are disposed between the first area A1 and the second area A2 of the bent flexible substrate 210A, and fill a partial space between the first area A1 and the second area A2 shown in FIG. 2A. The supplement members may further include convex parts extending between the first bending area BA1 and the second bending area BA2, and may be formed to fill a space between the first bending area BA1 and the second bending area BA2 to the utmost. A radius of curvature when the flexible substrate 210A is bent varies depending on a thickness of the supplement member.

Figure 2C:
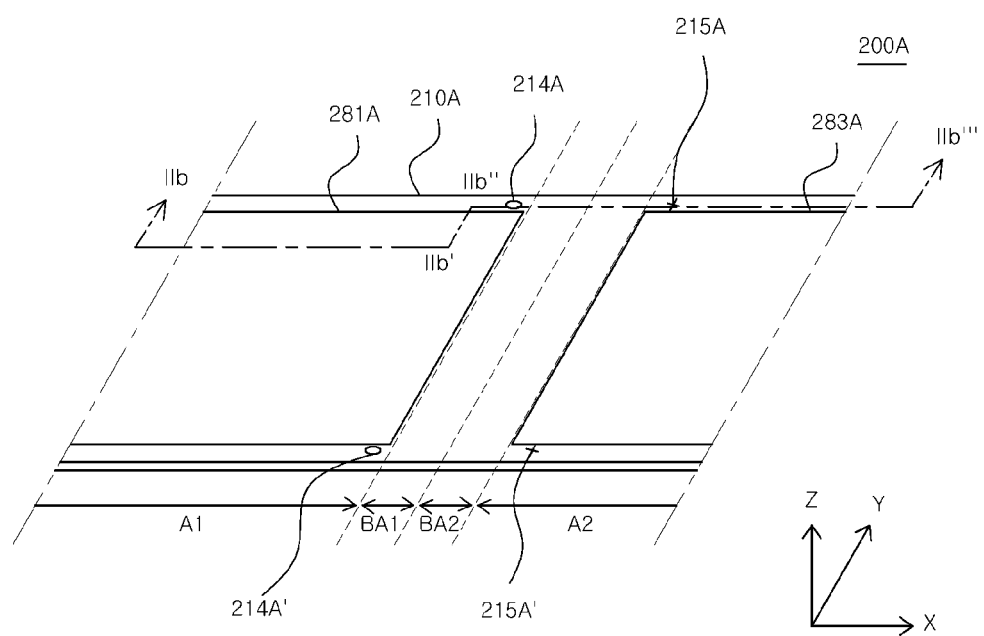
FIG. 2C is perspective view of the organic light-emitting display device shown in FIG. 1B as viewed from the bottom thereof, for illustrating arrangement of the first and second alignment keys and supporting films of the organic light-emitting display device shown in FIG. 1B.

FIG. 2C is perspective view of the organic light-emitting display device shown in FIG. 1B when viewed from the bottom for illustrating arrangement of the first and second alignment keys and supporting films of the organic light-emitting display device shown in FIG. 1B.

Referring to FIG. 2C, supporting films 281A and 283A are formed on a surface opposite to one surface on which the display unit 211A is formed in the first area A1 and the second area A2 of the flexible substrate 210A.

The supporting films 281A and 283A support the flexible substrate 210A to suppress elements such as the display unit 211A and the like from being damaged due to the infiltration of external moisture and air. The supporting films 281A and 283A may be made of polymer resin, and thicknesses of the supporting films 281A and 283A may be relatively thicker than that of the flexible substrate 210A. The supporting films are not formed in the first bending area BA1 and the second bending area BA2 that have a bent shape when the flexible substrate 210A is bent. Moreover, as shown in FIG. 2C, the supporting films 281A and 283A are not formed in the areas where the first alignment key 214A and the second alignment key 215A are formed such that whether or not the first alignment key 214A and the second alignment key 215A correspond to each other can be easily checked through the imaging devices such as cameras when the flexible substrate 210A is bent.

Although it has been illustrated in FIG. 2C that the supporting films 281A and 283A are not formed in the areas where the first alignment key 214A and the second alignment key 215A are formed, the supporting films 281A and 283A may be formed in the areas where the first alignment key 214A and the second alignment key 215A are formed.

When the supporting films are formed on the organic light-emitting display device 200A according to the exemplary embodiment of the present disclosure, the supplement members may be formed on the supporting films.

Figure 3:
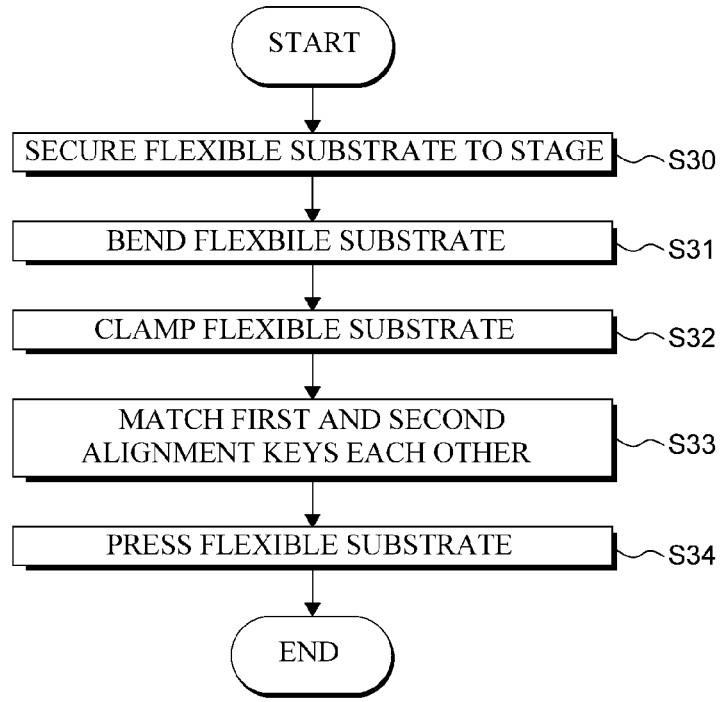
FIG. 3 is a flowchart illustrating a method for manufacturing an organic light-emitting display device according to an exemplary embodiment of the present disclosure.
Figure 4A:
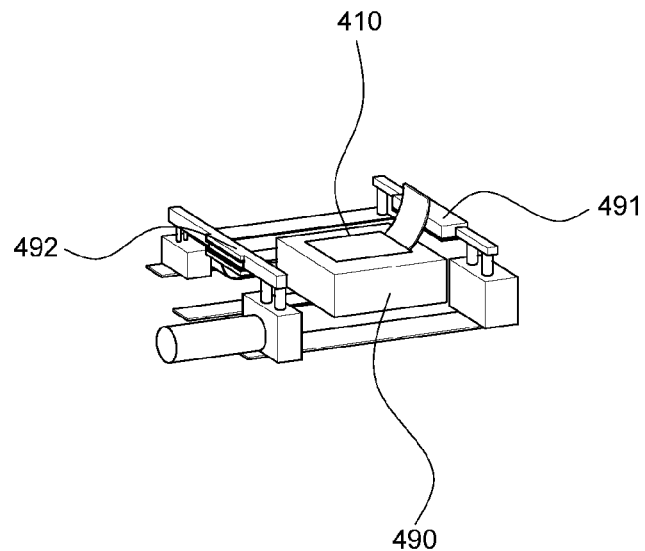
FIGS. 4A to 4C are cross-sectional views of processes for illustrating the method for manufacturing an organic light-emitting display device according to the exemplary embodiment of the present disclosure.
Figure 4B:
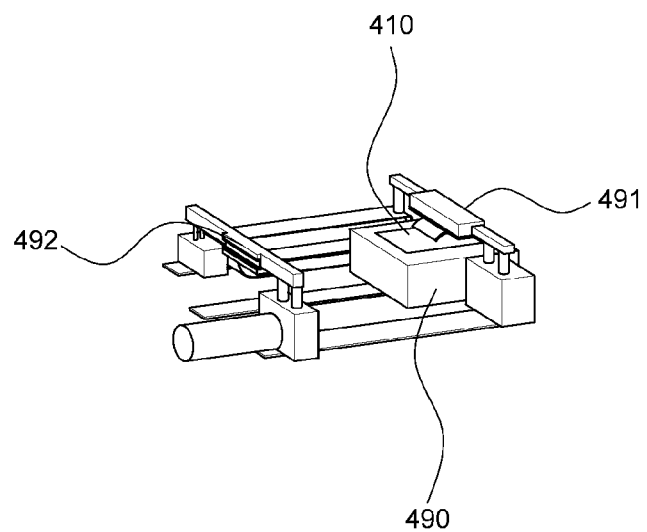
Figure 4C:
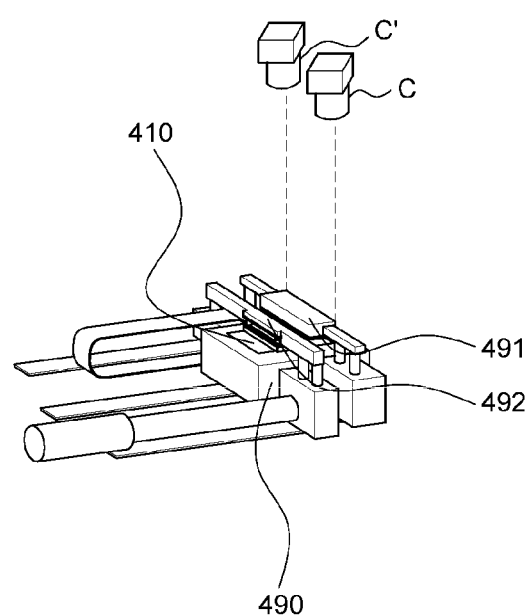

FIG. 3 is a flowchart for describing a method for manufacturing an organic light-emitting display device according to an exemplary embodiment of the present disclosure. FIGS. 4A to 4C are cross-sectional views of processes for describing the method for manufacturing an organic light-emitting display device according to the exemplary embodiment of the present disclosure.

First, the flexible substrate is fixed to a stage (S30).

The flexible substrate includes the first area, the first bending area extending from one side of the first area, the second bending area extending from the first bending area, and the second area extending from the second bending area. The first alignment keys are formed in at least one area of the first area and the first bending area, and the second alignment keys are formed in at least one area of the second area and the second bending area so as to correspond to the first alignment keys. In addition, the display unit is formed in the first area of the flexible substrate, the pad unit is formed in the second area, and the wiring unit that connects electrically the display unit and the pad unit is formed over the first area, the first bending area, the second bending area, and the second area.

The securing of the flexible substrate to the stage will be described in more detail with reference to FIG. 4A.

Referring to FIG. 4A, a flexible substrate 410 whose part is lifted by a lifting unit 491 is fixed to a stage 490. Here, the part of the flexible substrate 410 lifted by the lifting unit 491 is the second area, and a part thereof coming in contact with the stage 490 is the first area. By securing the first area to the stage 490, it is possible to protect the display unit formed in the first area from external impact applied while the flexible substrate 410 is bent.

Meanwhile, when the flexible substrate 410 is fixed to the stage 490, the flexible substrate 410 can be aligned with the stage 490 to be fixed so as to allow the flexible substrate 410 to be accurately bent in the intended bending direction.

In order to determine the radius of curvature of the flexible substrate 410, the supplement members may be disposed on the flexible substrate 410 fixed to the stage 490.

When the flexible substrate is fixed to the stage, the first bending area and the second bending area of the flexible substrate are bent (S31).

The bending of the first bending area and the second bending area of the flexible substrate will be described in more detail with reference to FIG. 4B.

Referring to FIG. 4B, by moving the stage 490 while the second area of the flexible substrate 410 is lifted by the lifting unit 491 and the first area of the flexible substrate 410 is fixed to the stage 490, the flexible substrate 410 fixed to the stage 490 is also moved. By moving the first area of the flexible substrate 410 fixed to the stage 490 to below the second area lifted by the lifting unit 491, the first bending area and the second bending area are bent. When the first bending area and the second bending area of the flexible substrate 410 are bent, the second area of the flexible substrate 410 faces the first area fixed to the stage 490, as shown in FIG. 4B.

When the first bending area and the second bending area of the flexible substrate are bent, the second area of the flexible substrate is clamped using a clamp (S32).

The clamping of the second area of the flexible substrate by using the clamp will be described in more detail with reference to FIG. 4C.

Referring to FIG. 4C, when the second area of the flexible substrate 410 faces the first area fixed to the stage 490, a clamp 492 is moved to a position of the second area to clamp the second area. When the second area of the flexible substrate 410 is clamped by the clamp 492, the first area of the flexible substrate 410 is fixed by the stage 490, and the second area is fixed by the clamp 492. Accordingly, by moving the stage 490 or the clamp 492, it is possible to more accurately adjust the bending direction of the flexible substrate 410.

When the second area of the flexible substrate is clamped, the stage or the clamp is moved to match the first alignment keys to the second alignment keys through the camera (S33).

In the present disclosure, the first alignment keys and the second alignment keys being matched to each other means that the stage 490 or the clamp 492 are moved to adjust positions of the first alignment keys and the second alignment keys while checking the positions of the first alignment keys and the second alignment keys through the imaging devices C and C' such as cameras such that the flexible substrate 410 is bent to allow the first alignment keys and the second alignment keys to face each other. By adjusting the positions of the first alignment keys and the second alignment keys, the bending direction of the flexible substrate 410 is adjusted.

It can be seen that when the first alignment keys and the second alignment keys are matched to allow the first alignment keys and the second alignment keys to face each other, the flexible substrate 410 is accurately bent in the intended bending direction. However, when the first alignment keys and the second alignment keys do not face each other, since the flexible substrate 410 is not accurately bent in the intended bending direction, the bending direction of the flexible substrate 410 can be adjusted until the stage 490 or the clamp 492 are moved to allow the first alignment keys and the second alignment keys to be face each other.

When the first alignment keys and the second alignment keys are elongated alignment keys, the bar-shape first alignment keys and the elongated second alignment keys can be matched while the first bending area and the second bending area are bent. In this case, since it can be continuously checked whether or not the elongated first alignment keys and the elongated second alignment keys face each other, the flexible substrate 410 can be accurately bent in the intended bending direction. Furthermore, when the first alignment keys include the plurality of patterns and the second alignment keys are formed to correspond to the plurality of patterns of the first alignment keys, the first alignment keys and the second alignment keys can also be matched while the first bending area and the second bending area are bent.

When the first alignment keys and the second alignment keys are matched, the flexible substrate is pressed (S34).

By pressing the flexible substrate, the first area of the bent flexible substrate comes in direct contact with the second area, so that the first alignment keys and the second alignment keys can face each other in parallel.

Hereinafter, various characteristics of an organic light-emitting display device in a bent state of a flexible substrate according to an embodiment of the present disclosure will be described.

According to another characteristic of the present disclosure, the first alignment keys and the second alignment keys face away each other.

According to still another characteristic of the present disclosure, an imaginary line extending between centers of the first and second keys is normal to the first area and/or the second area.

According to still another characteristic of the present disclosure, the first alignment key and/or the second alignment key has a hole.

According to still another characteristic of the present disclosure, the first and second alignment keys are connected to each other to form an elongated key.

According to still another characteristic of the present disclosure, one of the first and second alignment keys includes a plurality of patterns, and the other of the first and second alignment keys is formed to correspond to the plurality of patterns.

According to still another characteristic of the present disclosure, the wiring extends, across the first and second bending areas, in a direction oblique with respect to a direction perpendicular to one end side of the first or second area.

According to still another characteristic of the present disclosure, the wiring unit comprises a diamond-shaped wiring or a zigzag-shaped wiring.

According to still another characteristic of the present disclosure, the display unit includes a thin-film transistor and an organic light-emitting element.

According to still another characteristic of the present disclosure, the thin-film transistor includes a gate electrode, a source electrode, and a drain electrode, and the first and/or second alignment key is made of the same material as the gate electrode or the source and drain electrodes.

According to still another characteristic of the present disclosure, the organic light-emitting display device further includes an insulating layer formed on the flexible substrate, and the first and/or the second alignment key is formed on the insulating layer.

According to still another characteristic of the present disclosure, the insulating layer includes at least one of a buffer layer, a gate insulating layer, and an interlayer insulating layer.

According to still another characteristic of the present disclosure, the organic light-emitting display device further includes a sealing layer formed in the first area to cover the display unit, and the first alignment key is covered by the sealing layer.

According to still another characteristic of the present disclosure, the organic light-emitting display device further includes support films on faces of the first and second area, and the first and/or second alignment key is formed in an area other than the support films area.

According to still another characteristic of the present disclosure, the organic light-emitting display device further includes a supplement member disposed between the first and second areas.

Hereinafter, various characteristics of an organic light-emitting display device before a flexible substrate is bent according to an embodiment of the present disclosure will be described.

According to another characteristic of the present disclosure, the first and second alignment keys are formed on the same plane.

According to still another characteristic of the present disclosure, side ends of the first area, the first bending area, and the second bending area are parallel to each other.

Hereinafter, various characteristics of a method for manufacturing an organic light-emitting display device according to an embodiment of the present disclosure will be described.

According to another characteristic of the present disclosure, the securing of the flexible substrate includes aligning the flexible substrate with the stage via the imaging unit.

According to still another characteristic of the present disclosure, the bending of the first bending area and the second bending area is performed via movement of the stage.

According to still another characteristic of the present disclosure, the matching and bending operations are simultaneously performed.

The present disclosure has been described in more detail with reference to the exemplary embodiments, but the present disclosure is not limited to the exemplary embodiments. It will be apparent to those skilled in the art that various modifications can be made without departing from the technical sprit of the disclosure. Accordingly, the exemplary embodiments disclosed in the present disclosure are used not to limit but to describe the technical spirit of the present disclosure, and the technical spirit of the present disclosure is not limited to the exemplary embodiments. Therefore, the exemplary embodiments described above are considered in all respects to be illustrative and not restrictive. The protection scope of the present disclosure must be interpreted by the appended claims and it should be interpreted that all technical spirits within a scope equivalent thereto are included in the appended claims of the present disclosure.

What is claimed is:

1. An organic light-emitting display device comprising:
a flexible substrate bent across a bend line, the flexible substrate including a first area, a first bending area adjacent to the first area, a second bending area adjacent to the first bending area, and a second area adjacent to the second bending area, the flexible substrate bent such that the first area is positioned to at least partially overlap the second area and the first bending area is positioned to at least partially overlap the second bending area;
a display unit formed in the first area of the flexible substrate;
a pad unit formed in the second area of the flexible substrate;
a wiring unit configured to electrically connect together the display unit and the pad unit, the wiring unit formed across the first area, the first bending area, the second bending area, and the second area;
a first alignment key formed over the flexible substrate; and
a second alignment key formed over the flexible substrate, wherein the first alignment key is positioned to overlap the second alignment key with the flexible substrate bent across the bend line.

2. The organic light-emitting display device of claim 1, wherein the first alignment key is located in the first area and the second alignment key is located in the second area.

3. The organic light-emitting display device of claim 1, wherein the first alignment key is located in the first bending area and the second alignment key is located in the second bending area.

4. The organic light-emitting display device of claim 1, wherein the first alignment key is positioned to overlap the second alignment key such that a center of the first alignment key is in line with a center of the second alignment key when viewed from a direction normal to the first area and the second area.

5. The organic light-emitting display device of claim 1, wherein the first alignment key has a circular shape and the second alignment key has a cross shape.

6. The organic light-emitting display device of claim 5, wherein the first alignment key is positioned to overlap the second alignment key such that a center of the cross shape of the second alignment key is in line with a center of the circular shape of the first alignment key when viewed from a direction normal to the first area and the second area.

7. The organic light emitting display device of claim 1, wherein the second alignment key extends from the first alignment key, the first alignment key and the second alignment key forming a rectangle.

8. The organic light-emitting display device of claim 7, wherein a first portion of the rectangle corresponding to the first alignment key is in line with a second portion of the rectangle corresponding to the second alignment key when viewed from a direction normal to the first area and the second area.

9. The organic light emitting display device of claim 7, wherein the rectangle spans across the first area, the first bending area, the second bending area, and the second area.

10. The organic light emitting display device of claim 1, wherein the first alignment key includes a pattern of shapes and the second alignment key includes a line.

11. The organic light emitting display device of claim 10, wherein the pattern of shapes includes a first row of shapes and a second row of shapes, and the line of the second alignment key is positioned between the first row of shapes and the second row of shapes when viewed from a direction normal to the first area and the second area.

12. The organic light emitting display device of claim 1, wherein the wiring extends across the first bending area and the second bending area oblique to a direction of bending of the flexible substrate across the bend line.

13. The organic light emitting display device of claim 12, wherein the wiring unit comprises a diamond-shaped wiring or a zigzag-shaped wiring.

14. The organic light emitting display device of claim 1, wherein the display unit includes an organic light-emitting element and a thin-film transistor including a gate electrode, a source electrode, and a drain electrode, and wherein at least one of the first alignment key and the second alignment key is made of a same material as the source electrode and the drain electrode or is made of a same material of the gate electrode.

15. The organic light emitting display device of claim 1, further comprising:
  an insulating layer formed on the flexible substrate;
  wherein the first alignment key and the second alignment key are formed on the insulating layer.

16. The organic light emitting display device of claim 15, wherein the insulating layer includes at least one of a buffer layer formed on the flexible substrate, a gate insulating layer formed on the buffer layer, and an interlayer insulating layer formed on the gate insulation layer.

17. The organic light emitting display device of claim 1, further comprising:
  a sealing layer covering the display unit and the first alignment key.

18. The organic light emitting display device of claim 1, wherein the display unit and the pad unit are formed on a first surface of the flexible substrate, and the organic light emitting display device further comprises:
  a first film formed in the first area on a second surface of the flexible substrate that is opposite the first surface of the flexible substrate;
  a second film formed in the second area of the second surface of the flexible substrate; and
  wherein the first alignment key and the second alignment key are formed in an area not including the first film and second film.

19. An organic light-emitting display device comprising:
  a flexible substrate, the flexible substrate including a first area, a first bending area adjacent to the first area, a second bending area adjacent to the first bending area, and a second area adjacent to the second bending area;
  a display unit formed in the first area of the flexible substrate;
  a pad unit formed in the second area of the flexible substrate;
  a wiring unit configured to electrically connect together the display unit and the pad unit, the wiring unit formed across the first area, the first bending area, the second bending area, and the second area;
  a first alignment key formed over the flexible substrate; and
  a second alignment key formed over the flexible substrate,
  wherein the first alignment key and the second alignment key are positioned to be symmetric with respect to a boundary between the first bending area and the second bending area.

20. The organic light-emitting display device of claim 19, wherein a distance from a center of the first alignment key to the boundary is substantially the same as a distance from a center of the second alignment key to the boundary.

* * * * *